(12) United States Patent  
Hamashita et al.

(10) Patent No.: US 7,889,108 B2
(45) Date of Patent: Feb. 15, 2011

(54) HYBRID DELTA-SIGMA ADC

(75) Inventors: Koichi Hamashita, Tokyo (JP); Gábor C Temes, Corvallis, OR (US); Yan Wang, Corvallis, OR (US)

(73) Assignee: Asahi Kasei Microdevices Corporation, Tokyo (JP)

( * ) Notice: Subject to any disclaimer, the term of this patent is extended or adjusted under 35 U.S.C. 154(b) by 6 days.

(21) Appl. No.: 12/436,813

(22) Filed: May 7, 2009

(65) Prior Publication Data

US 2009/0278721 A1 Nov. 12, 2009

Related U.S. Application Data

(60) Provisional application No. 61/051,840, filed on May 9, 2008.

(51) Int. Cl.
*H03M 3/00* (2006.01)
(52) U.S. Cl. .................... 341/143; 341/144; 341/155; 341/156
(58) Field of Classification Search ............. 341/143, 341/155, 156, 144
See application file for complete search history.

(56) References Cited

U.S. PATENT DOCUMENTS

| 6,144,328 | A | * | 11/2000 | Eastty et al. | 341/143 |
| 6,326,912 | B1 | | 12/2001 | Fujimori | |
| 6,339,621 | B1 | * | 1/2002 | Cojocaru et al. | 375/247 |
| 7,031,395 | B2 | * | 4/2006 | Hinrichs et al. | 375/245 |
| 2007/0127761 | A1 | | 6/2007 | Poulsen | |

OTHER PUBLICATIONS

Silva, J. et al., "Wideband Low-Distortion Delta-Sigma ADC Topology", Electron Lett., Jun. 2001, pp. 737-738, vol. 37, No. 12.
Schreier, R. et al., "Understanding Delta-Sigma Data Converters", Appendix B: The Delta-Sigma Toolbox 7.2, John Wiley & Sons, Inc., 2005, pp. 389-415.
Schreier, R. et al., "Understanding Delta-Sigma Data Converters", John Wiley & Sons Inc., 2005, pp. 338-343, Section 9.6.1.

* cited by examiner

*Primary Examiner*—Jean B Jeanglaude
(74) *Attorney, Agent, or Firm*—Vern Maine & Associates

(57) ABSTRACT

A hybrid delta sigma ADC architecture and method is disclosed to implement a high-resolution delta-sigma modulator with a single-bit output. The system contains a low-order multi-bit analog noise-shaping loop, followed by a high-order single-bit digital modulator. The combination simplifies the analog modulator, and allows the use of most of the full-scale input range.

26 Claims, 13 Drawing Sheets

700

US 7,889,108 B2

HYBRID DELTA-SIGMA ADC

RELATED APPLICATIONS

This application claims the benefit of U.S. Provisional Application No. 61/051,840, filed May 9, 2008; this application is herein incorporated in its entirety by reference.

FIELD OF THE INVENTION

The invention relates to delta-sigma modulators and, more particularly, to a hybrid delta-sigma modulator analog to digital converter and method.

BACKGROUND OF THE INVENTION

Existing delta-sigma analog to digital converters (ADCs) contain an analog noise-shaping loop, followed by a digital decimation filter which suppresses the out-of-band quantization error and permits a reduced clock frequency close to the Nyquist rate. Often, the analog loop and the digital filter are integrated on the same chip. However, in some specific applications (e.g., in some digital audio systems) the analog loop and the decimation filter must be in different physical locations. In this case, the loop should operate with a 1-bit digital output to allow the use of a standard digital interface with high dynamic range. It should also have a nearly full-scale input range, which is hard to achieve with single-bit noise shaping.

A use of analog to digital (A/D) converters in digital audio apparatus is to carry out A/D conversion of the input sound and music signal from a microphone for digital media. However, output level of the microphone (which changes the air vibration from a sound source into an analog electricity signal) is extremely small. Even when amplified by an electric amplifier, the analog output signal level from a microphone is at most about few millivolts. The input full-scale level of an A/D converter with a signal to noise ratio (SNR) of 90 dB has a dynamic range of usually about several volts. In this case, a 10 dB to 40 dB amplifier is required between the microphone and ADC. Moreover, the distance between a microphone and sound source is not usually fixed. The above-mentioned amplifier normally has a variable gain amplifier which can change gain value according to the situation for optimal recording. Noise in the analog wiring from the microphone to the variable amplifier and the A/D converter is a significant problem.

Usually, a microphone is arranged near the sound source (such as man and a musical instrument) and a variable amplifier and A/D converter are arranged in a digital audio apparatus such as a recorder. The signal transmission between the microphone and digital apparatus is carried by analog wiring. Therefore, if a disturbance noise appears in this analog wiring, the noise will be amplified by the variable amplifier. This will be input to the A/D converter. This causes significant tone quality degradation.

U.S. Pat. Application Publication, Pub. No.: US 2007/0127761 (Pub. Date: Jun. 7, 2007), "Microphone Comprising Integral Multi-level Quantizer and Single bit Conversion Means", discloses a digital microphone comprising an integral analog-to-digital converter based on a analog delta sigma modulator with multi-level quantizer in cascade with a digital signal converter which is adapted to provide a single-bit output signal. It focuses on a digital microphone application. It discloses two types of embodiments where the digital signal converter is adapted to provide a single-bit output signal. The first type is a single bit digital delta sigma converter of FIG. 2 in U.S. 2007/0127761, and the second type is direct symbol mapping method of FIG. 3 in U.S. 2007/0127761. But it does not describe analog performance and output signal duty ratio.

In the case of today's digital microphone application with single bit PDM signal output, several important target specifications are signal bandwidth, signal to noise ratio, oversampling ratio, and output signal duty ratio, etc. These are described later in Table 1. Oversampling Ratio is normally fixed to 64 times, that means over sampling rate is 64 times 48 kHz for the conventional DVD system, and 64 times 44.1 kHz for the Super Audio Compact Disc (SACD) system.

In the case of the direct symbol mapping method of FIG. 3 in U.S. 2007/0127761, the oversampling ratio of the multi-level analog delta sigma modulator should be expanded to double for tri-level, or quadruple for fifth-level, etc. This means that the oversampling ratio of the multi-level analog delta sigma modulator should be reduced to 32 times for tri-level quantizer, or to 16 times for fifth-level quantizer, to get the oversampling ratio of 64 times on the single bit output of the direct symbol mapping method. In the case of the delta sigma modulator, the signal to noise ratio will be drastically reduced by the reduction of oversampling ratio and cannot be compensated with such small levels as tri-level or fifth-level. Therefore, the direct symbol mapping method is not feasible to achieve a sufficient signal to noise ratio for digital microphone applications.

Another embodiment in U.S. 2007/0127761 is a third-order analog delta sigma modulator with multi-level quantizer of FIG. 4 in US 2007/0127761. It is cascaded with the same third-order single bit digital delta sigma converter of FIG. 2 in US 2007/0127761. In this embodiment, the loop order of both modulators is the same and the circuit topologies are designed as compatible with each other. The only difference is that the quantizer is multi-level versus single-bit. The signal to noise ratio of the total system will be limited by the single-bit digital delta sigma modulator and also by the chip area and power consumption for the third-order analog delta sigma modulator. These would be too much for the needed signal to noise ratio of total system. Additionally, there is no description or design consideration regarding the overload that will happen in the delta sigma modulator for large analog signal input. There is also no consideration regarding the duty ratio of the single-bit output signal. To get enough dynamic range on the single-bit output signal, the duty ratio would be near 90% or more for the maximum analog input level; this is more difficult in higher order delta sigma modulators. This means that the order and circuit topology should be separately considered so as to get best performance with low power consumption and cost for the digital microphone application.

U.S. Pat. No. 6,326,912 discloses an analog-to-digital converter comprising a front-end multi-bit delta sigma modulator coupled directly, or indirectly, to a back-end single-bit delta sigma modulator. The disclosed main application is a 1 bit stream format recordable system, Super Audio Compact Discs, used for DVD Audio systems or special format Audio CD recording systems. The disclosed embodiments are mainly focusing on the use of multi-bit analog delta sigma modulators including multi-stage cascaded topology for the application of 1 bit stream format of SACD. This uses a back-end 1 bit digital delta sigma modulator, and also focuses on a sampling rate conversion between both delta sigma modulators usable in the case of parallel usage with a conventional decimator to get a conventional Nyquist rate 16 to 24 bit PCM audio signal. Nyquist rate is 48 kHz in a DVD audio system and 44.1 kHz in a CD audio system. U.S. Pat. No. 6,326,912 includes comments about overload in the conventional $5^{th}$ order single loop 1 bit delta-sigma modulator. It uses a gain scaling method to avoid overload and to get a stable higher-order loop. However, the gain scaling method will result in attenuation of the input signal, and then reduction of dynamic range of the 1 bit PDM output signal. That is, the duty ratio of the 1 bit PDM signal becomes 50% when the gain scaling is 50%. In U.S. Pat. No. 6,326,912, because this gain-scaled 1 bit delta sigma modulator with the duty ratio of the 1 bit PDM signal as low as 50% for the maximum analog input was already used in the main application of SACD, there was not enough consideration for the duty ratio of the 1 bit PDM signal. This is a very important specification for today's digital microphone application.

What is needed are techniques for separate analog loop and digital filter components that provide high dynamic, near full scale range performance for use with a standard digital interface. The above so-called analog microphone particularly has a need to mitigate noise in the analog signal line. The hybrid delta-sigma modulator described solves such problems.

SUMMARY OF THE INVENTION

A hybrid architecture and method provide a robust high-resolution delta-sigma modulator with a single-bit output. The system contains a low-order multi-bit analog noise-shaping loop, followed by a high-order single-bit digital modulator. The combination simplifies the realization of the analog modulator, and it allows the use of most of its full-scale input range.

Embodiments include a hybrid delta sigma analog to digital converter system comprising an analog loop comprising a low-order analog delta-sigma modulator and a digital loop comprising a higher-order single-bit digital delta-sigma modulator operably coupled to the analog loop. In other embodiments the analog modulator comprises a multi-bit quantizer and the analog modulator further comprises a discrete-time loop filter or a continuous-time loop filter. In another embodiment, the digital loop further comprises an interstage attenuator wherein stability of the digital loop is improved. In yet another embodiment, the digital loop further comprises a digital low pass filter (LPF) wherein stability of the digital loop is improved. Further embodiments comprise an internal multi-bit digital to analog converter (DAC) employing dynamic element matching wherein in-band noise created by element mismatch is suppressed. In yet other embodiments, the low-order analog delta-sigma modulator is a second-order or greater-than second-order analog delta-sigma modulator. In embodiments, the analog modulator comprises a multi-bit quantizer. For other embodiments, the higher-order single-bit digital delta-sigma modulator is a third-order or greater-than third-order digital delta-sigma modulator. In yet other embodiments, the low-order analog delta-sigma modulator is a third-order analog delta-sigma modulator and the higher-order single-bit digital delta-sigma modulator is a fourth-order or greater-than fourth-order digital delta-sigma modulator. In embodiments, the system further comprises an amplifier with fixed gain coupled to the low-order analog delta-sigma modulator. Additional embodiments further comprise an amplifier with programmable gain coupled to the low-order analog delta-sigma modulator in a single package or a single chip. For another embodiment, the sampling rate, and hence the oversampling ratio, is the same for the analog and digital loops.

One embodiment is a one-bit digital output microphone system comprising a microphone; an amplifier operatively coupled to the microphone; a low-order analog delta-sigma modulator operatively coupled to the amplifier; and a higher-order single-bit digital delta-sigma modulator operably coupled to the low-order analog delta-sigma modulator. For embodiments, the one-bit digital output microphone system is embodied in a single package or a single chip. For other embodiments, the sampling rate and resultant oversampling ratio are the same for the analog loop and the digital loop.

Yet another embodiment includes a method for performing a hybrid delta sigma analog to digital conversion comprising the steps of: receiving an analog signal; processing the analog signal in a low-order analog delta-sigma modulator in an analog loop; attenuating output of the low-order analog delta-sigma modulator in a digital loop; filtering in the digital loop the attenuated output of the low-order analog delta-sigma modulator to produce a filtered signal; and generating in a higher-order single-bit digital delta-sigma modulator in the digital loop a digital output signal from the filtered signal.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 1:
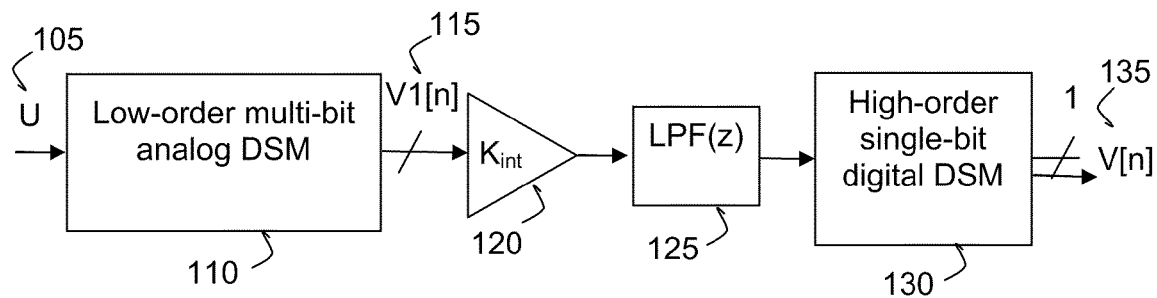
FIG. 1 is a block diagram of a hybrid delta-sigma modulator configured in accordance with one embodiment of the present invention.

FIG. 1 shows a block diagram of the architecture 100 of an embodiment of the invention. The input signal 105 is first converted by a low-order analog delta-sigma modulator (DSM or ΔΣ modulator) 110 with a multi-bit quantizer, and then its output is further processed by a higher-order single-bit digital delta-sigma modulator 130 with output V[n] 135. The analog modulator 110 may have either a discrete-time or continuous-time loop filter, depending on the specifications of the ADC. To suppress in-band noise due to mismatch of its elements, the internal multi-bit digital to analog converter (DAC) may also employ dynamic element matching. The sampling rate, and hence the oversampling ratio (OSR), is the same for the analog and digital loops. The low-order multi-bit analog modulator 110 with output 115 is easy to stabilize, and it will not become overloaded even for inputs 105 close to full scale. The design of the digital loop is more challenging but it is not subject to the non-ideal effects occurring in analog loops. Hence, its stability can be established by proper design, and can be verified by simulation. An interstage attenuator, $K_{int}$ 120 and digital low pass filter (LPF) 125 can also be added to improve the stability and performance of the digital loop.

The quantization errors of the two cascaded loops are uncorrelated, so that only their powers are added in the final output signal. Thus, if the in-band noise power contributed by the digital loop is significantly lower than that of the analog one, the signal-to-noise+distortion ratio (SNDR) of the combination is only slightly less than that of the analog loop alone.

As an illustration of an embodiment of the ADC design technique, a converter was designed for the specifications in Table 1.

TABLE 1

Illustrative Specifications for an embodiment of a design

| Design Parameter | Specification |
| --- | --- |
| Signal Band | 0-22 KHz |
| Oversampling Ratio | 64 |
| SNDR | 85 dB |
| DR | 85 dB |
| Output signal duty ratio (the ratio of 1s in the output data) for full-scale input | >90% |

A second-order analog modulator with a 3-bit quantizer achieves SNDR ~94 dB, above the design SNDR. A fourth-order digital modulator with 1-bit output can provide SNDR>100 dB. Hence, their cascade will also satisfy the design illustration example. To reduce the signal levels, and hence also the power dissipation, in the loop filter the analog modulator may employ low-distortion feed-forward architecture as described in J. Silva, U. Moon, J. Steensgaard, and G. Temes, "Wideband low-distortion delta-sigma ADC topology," *Electron. Lett.* vol. 37, no. 12, pp. 737-738, June 2001. However, in the digital modulator the feedback architecture is employed, since then the signal transfer function reduces the out-of band output noise of the analog modulator. The block diagrams for the analog and digital modulators are shown in FIGS. 2 and 3, respectively.

Figure 2:
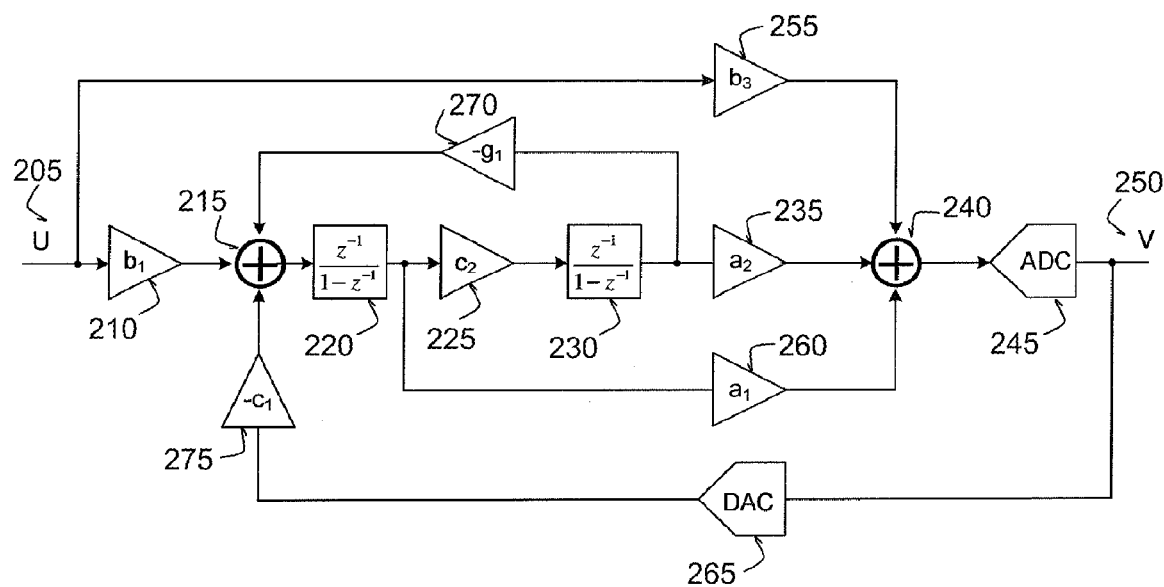
FIG. 2 is a block diagram of a discrete-time analog delta-sigma modulator configured in accordance with one embodiment of the present invention.

FIG. 2 shows a block diagram of a second order discrete-time analog delta-sigma modulator 200 with a 3-bit quantizer configured in accordance with one embodiment of the present invention. The configuration components include scaling block paths 210, 225, 235, 255, 260, and 275; summing nodes 215 and 240; ADC 245; and DAC 265. Integrators 220 and 230 are typically realized as delaying structures, as shown in FIG. 2. Input U 205 is applied to paths 210 and 255 with coefficients $b_1$, and $b_3$, respectively. Output of path 210 is applied to summing node 215. Outputs of paths 270 and 275 are additionally applied to summing node 215. Output of summing node 215 is applied to input of integrator 220. Output of integrator 220 is applied to path 225 with a coefficient $c_2$ and path 260 with a coefficient $a_1$. Output of path 225 is applied to input of integrator 230. Integrator 230's output is applied to path 235 having a coefficient $a_2$ and path 270 with a coefficient $-g_1$. As previously noted, output of path 270 is applied to summing node 215. Output of path 235 is applied to summing node 240. Outputs of paths 255 and 260 are additionally applied to summing node 240. Output of summing node 240 is applied to ADC 245. ADC 245 is in connection with DAC 265, and ADC 245 provides output V 250. DAC 265 provides input to path 275 which has a coefficient $-c_1$.

Figure 3:
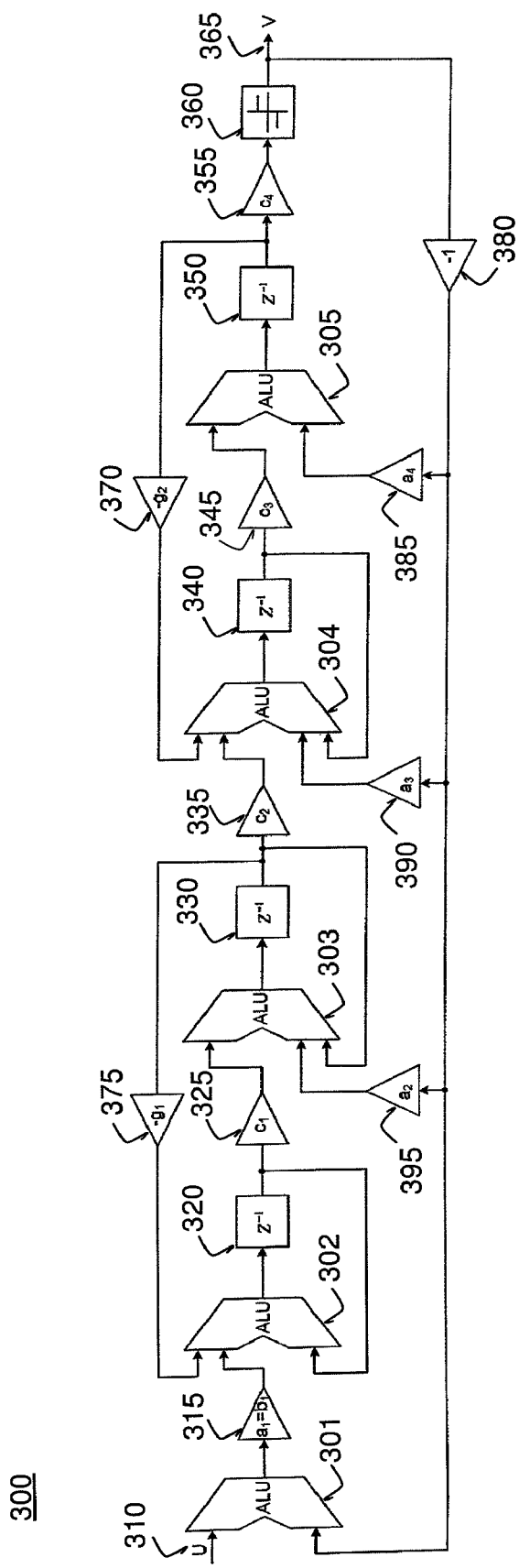
FIG. 3 is a block diagram of the digital delta-sigma modulator configured in accordance with one embodiment of the present invention.

FIG. 3 is a block diagram 300 of a fourth-order digital delta-sigma modulator with 1-bit output configured in accordance with one embodiment of the present invention. The configuration includes four registers 320, 330, 340, and 350. Components also include arithmetic logic unit (ALU) adders 301, 302, 303, 304, and 305, and scaling block paths 315, 325, 335, 345, 355, 370, 375, 380, 385, 390, and 395. Output 365 is from quantizer 360. Input U, 310, is applied to adder 301. Adder 301 also receives input from path 380. Output of adder 301 is applied to path 315 with coefficients $a=b_1$. Output of path 315 is applied to adder 302 which also receives input from path 375 and register 320 output. Output from adder 302 is applied to register 320. Register 320 output is applied to path 325 having a coefficient $c_1$ and also to input of adder 302 as mentioned. Output of path 325 is applied to adder 303. Adder 303 also receives input from path 395 and from register 330 output. Path 395's coefficient is $a_2$. Adder 303 output is applied to input of register 330. Register 330 output is applied to paths 335, 375, and to input of adder 303. Path 375's coefficient is $-g_1$. Path 335's coefficient is $c_2$. Output of path 335 is applied to input of adder 304. Inputs to adder 304 also include paths 370, 390, and output from register 340. Coefficients of paths 370 and 390 are $-g_2$ and $a_3$, respectively. Output of adder 304 is applied to input of register 340. Register 340 output is applied to path 345 and input of adder 304. Path 345's coefficient is $c_3$. Output of path 345 is applied to input of adder 305. Adder 305 also has an input from path 385. The coefficient of path 385 is $a_4$. Adder 305's output is applied to input of register 350. Register 350's output is applied to inputs of paths 355 and 370. The coefficient of path 355 is $c_4$. The output of path 355 is applied to the input of quantizer 360. The output of quantizer 360 is applied to the input of path 380 and is output V 365. The output of path 380 is applied to the inputs of paths 385, 390, 395, and input of adder 301. The coefficient of path 380 is −1.

For the selected architectures, each modulator's noise transfer function can be found using the MATLAB® Delta-Sigma Toolbox, particularly R. Schreier, "The Delta-Sigma Toolbox 7.2", http://www.mathworks.com/matlabcentral/fileexchange/loadFile.do?objectId=19. MATLAB® is a registered trademark of The MathWorks™, Inc. One can use the design parameters OSR=64, nLev=8, H_inf=2.8, and Order=2, where OSR is the oversampling ratio, nLev is the number of levels in the quantizer, and H_inf is the maximum out-of-band gain of the noise transfer function (NTF). The resulting NTF is $$\text{HNTF\_A} = \frac{z^2 - 1.999z + 1}{z^2 - 0.3364z + 0.09184}$$

The values of the path coefficients of the block diagram are shown in Table 2.

TABLE 2

Embodiment coefficients of an analog second-order modulator.

| Coefficient | Value | Coefficient | Value |
|---|---|---|---|
| a1 | 2.6690 | a2 | 5.6923 |
| b1 | 0.6233 | b3 | 1 |
| c1 | 0.6233 | c2 | 0.2127 |
| g1 | 0.0038 | | |

To obtain the correct full-scale output for the digital loop, the interstage gain $K_{int}$ was set to 0.84.

The design parameters for the digital loop were OSR=64, nLev=2, H_inf=1.25 and Order=4. Here OSR is again the oversampling ratio, nLev is the number of levels in the quantizer, and H_inf is the maximum out-of-band gain of the noise transfer function (NTF). The resulting noise transfer function is:

$$\text{HNTF\_D} = \frac{(z-1)^2(z^2 - 1.998z + 1)}{(z^2 - 1.704z + 0.7291)(z^2 - 1.65z + 0.6769)}$$

The values of the path coefficients of the digital loop shown in FIG. 3 are given in Table 3.

TABLE 3

Coefficients of an embodiment of a fourth-order digital modulator

| Coefficient | Value | Coefficient | Value | Coefficient | Value | Coefficient | Value |
|---|---|---|---|---|---|---|---|
| a1 | 0.0312 | a2 | 0.0697 | a3 | 0.0704 | a4 | 0.1656 |
| b1 | 0.0312 | | | | | | |
| c1 | 0.125 | c2 | 0.125 | c3 | 0.5 | c4 | 2.6963 |
| g1 | 0.0022 | g2 | 0.0036 | | | | |

For the hardware implementation of the digital delta-sigma modulator, the finite word length effect for each adder within the modulator loop was also considered. Here, word lengths were chosen such that the in-band quantization noise caused by the finite precision is below −110 dBFS. The method described in R. Schreier and G. C. Temes, *Understanding Delta-Sigma Data Converters*, John Wiley & Sons, New York, 2005, Section 9.6.1 shows that the first, second, third and fourth accumulators need word lengths of 20 bits, 18 bits, 17 bits and 13 bits, respectively.

The system design described was simulated, including the finite wordlength effects of the digital loop.

Figure 6:
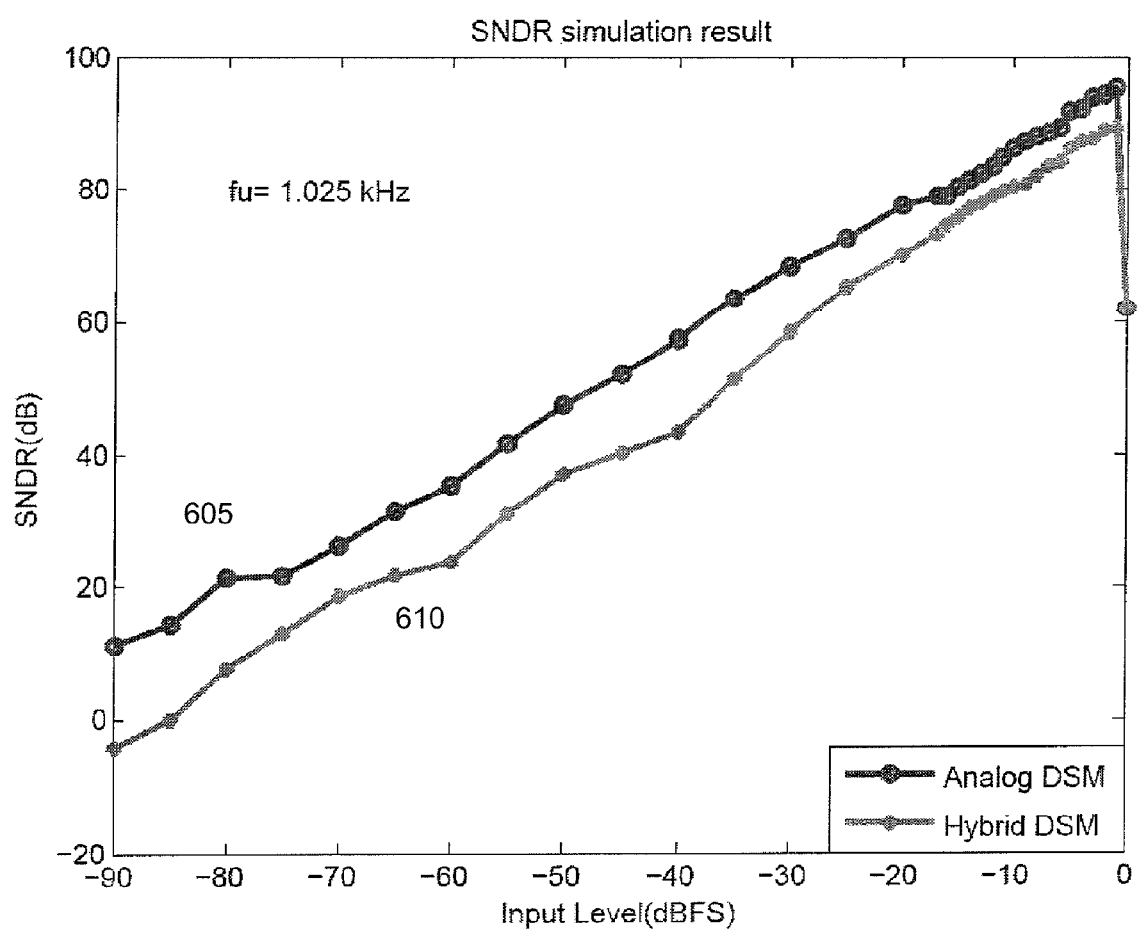
FIG. 6 depicts signal-to-noise+distortion ratio/dynamic range (SNDR/DR) simulation results for a 1 kHz input signal for an embodiment of the present invention.
Figure 7:
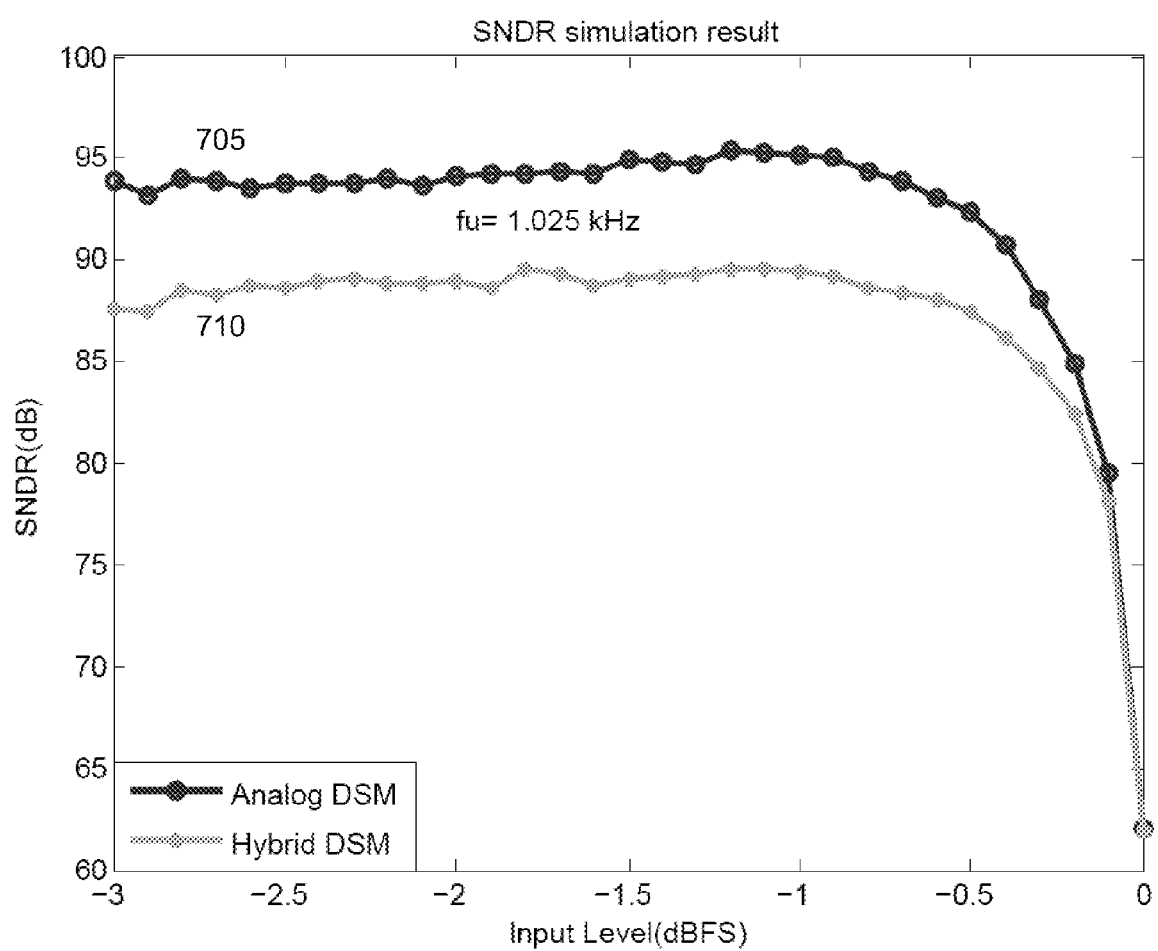
FIG. 7 depicts the signal-to-noise+distortion ratio (SNDR) for a 1 kHz signal with input levels from −3 decibel full-scale (dBFS) to 0 dBFS for an embodiment of the present invention.
Figure 8:
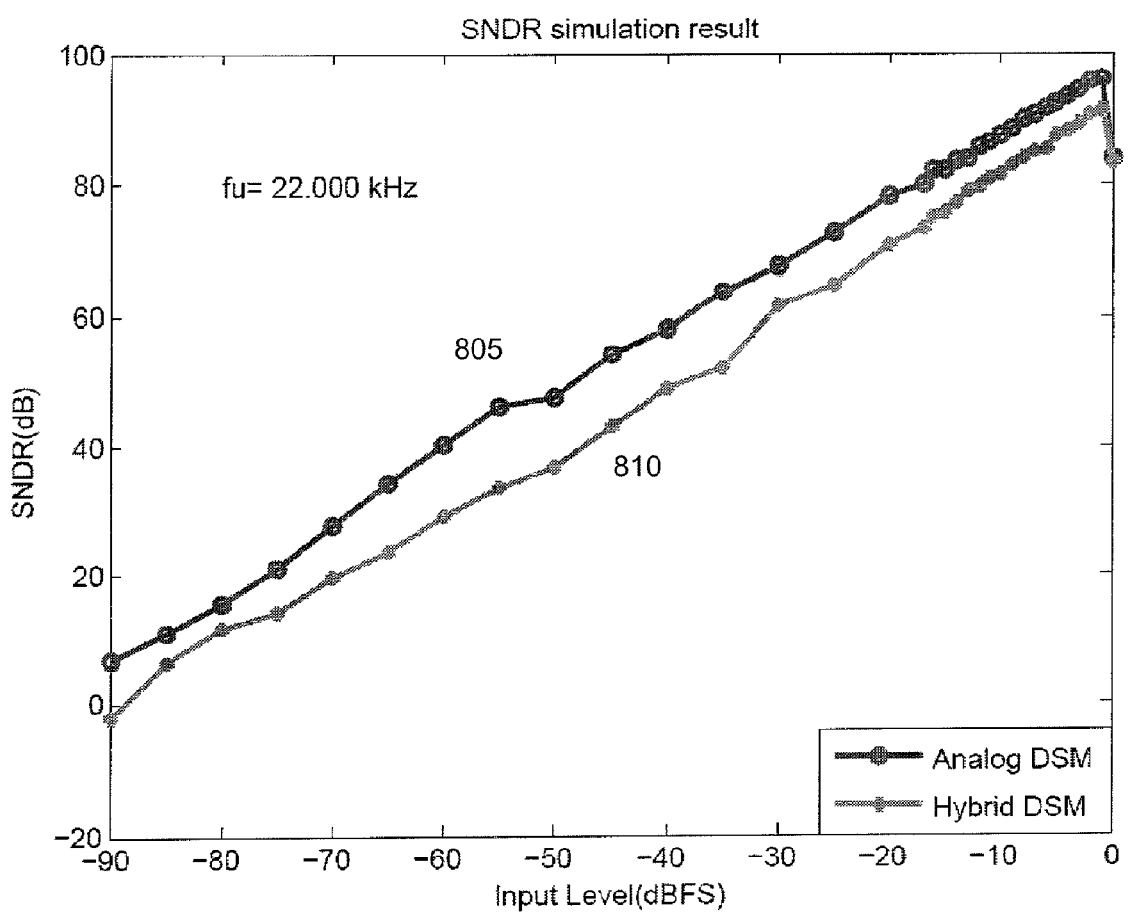
FIG. 8 depicts SNDR/DR simulation results for a 22 kHz input signal for an embodiment of the present invention.
Figure 9:
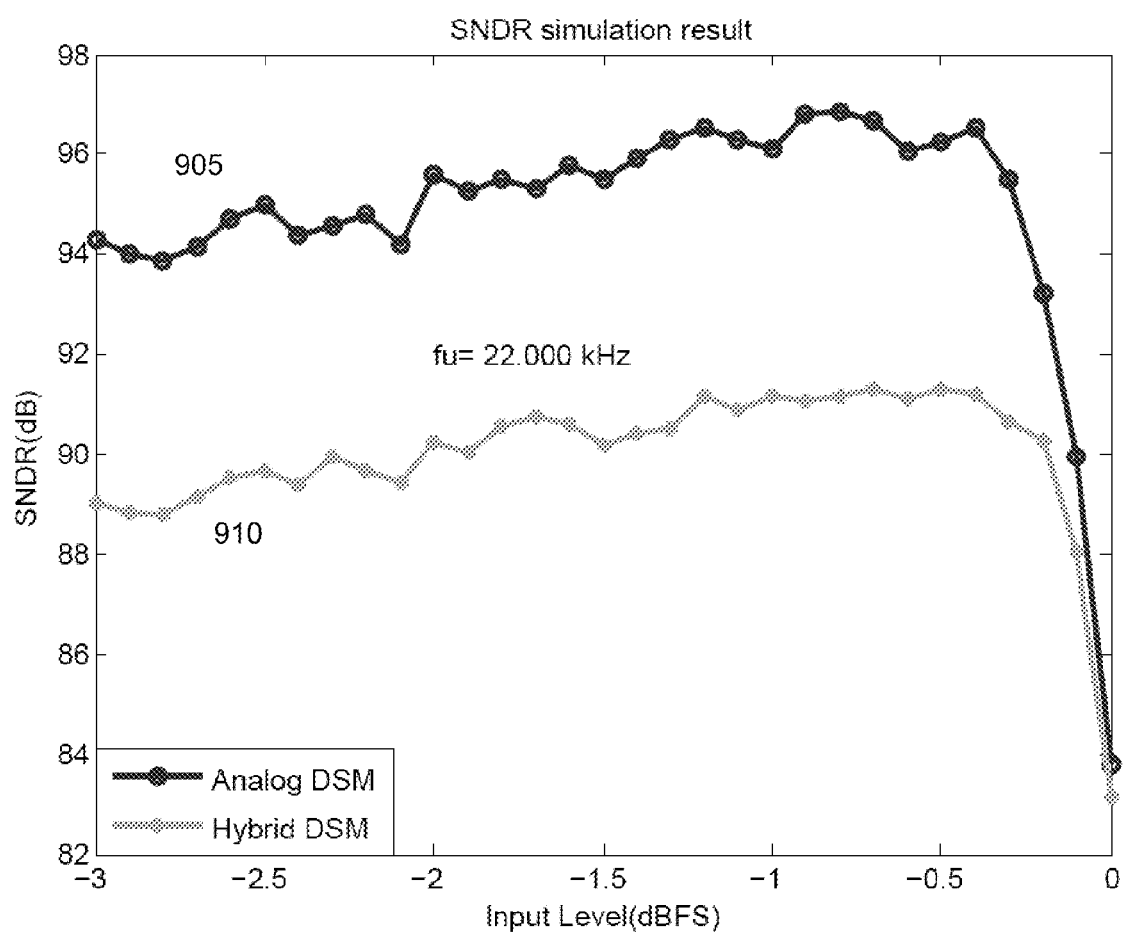
FIG. 9 depicts the SNDR for a 22 kHz signal with input levels from −3 dBFS to 0 dBFS for an embodiment of the present invention.

The SNDR and DR performances with a low frequency (1 kHz) sine-wave input signal are shown in FIGS. 6 and 7. FIGS. 8 and 9 illustrate the simulation results for a high-frequency (22 kHz) input signal. The simulated power spectrum density (PSD) of the output data with various input sine-wave signals is illustrated in FIGS. 10-13. As demonstrated by the simulation results, the SNDR and DR specifications are met even for input signals only 0.45 dB below full scale.

Simulations also showed that the output duty ratio for full-scale input was 90.52%, also meeting the specifications.

Figure 4:
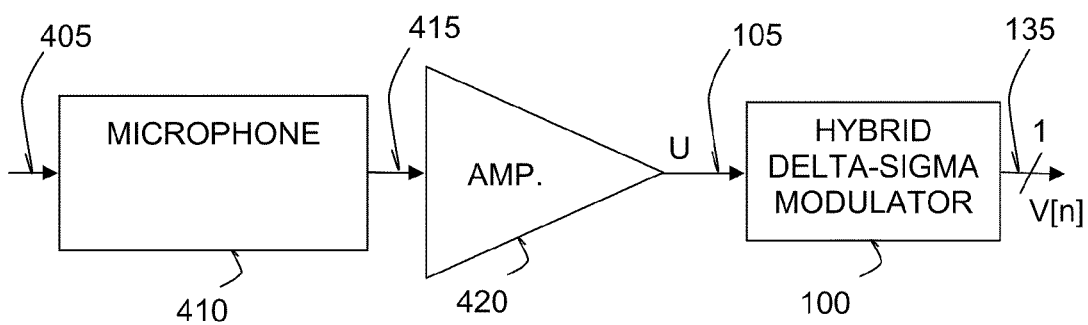
FIG. 4 is a block diagram of a one-bit digital output microphone system configured in accordance with one embodiment of the present invention.

FIG. 4 is a block diagram of a one-bit digital output microphone system 400 in accordance with one embodiment of the present invention. One-bit digital output microphone system 400 contains a microphone 410, an amplifier 420, and hybrid delta-sigma modulator 100 (similarly numbered in FIG. 1). One-bit digital output microphone system 400 can be embodied in a single chip, when the microphone 410 is made, for example, by silicon Micro-Electro-Mechanical System (MEMS) technology. One-bit digital output microphone system 400 can also be embodied by a microphone 410 and a single chip including amplifier 420 and hybrid delta-sigma modulator 100. One-bit digital output microphone system 400 can also be embodied in a single package. One-bit digital output microphone system 400 outputs a one-bit digital output signal which is, for example, a one-bit Pulse Density Modulation (PDM) signal. Microphone 410 receives audio sound 405 and converts it to an electrical analog audio signal 415. In embodiments, microphone 410 is a silicon microphone made by MEMS technology, or a dynamic microphone. An amplifier 420 receives electrical analog signal 415 from microphone 410, amplifies it and outputs the amplified analog signal U 105 (similarly numbered in FIG. 1) to the hybrid delta-sigma modulator 100 (again, similarly numbered in FIG. 1). In embodiments, amplifier 420 contains a fixed gain amplifier and/or a programmable gain amplifier. Hybrid delta-sigma modulator 100 converts analog signal U 105 to a one-bit digital signal, and outputs it as signal V[n] 135 (similarly numbered in FIG. 1).

Figure 5:
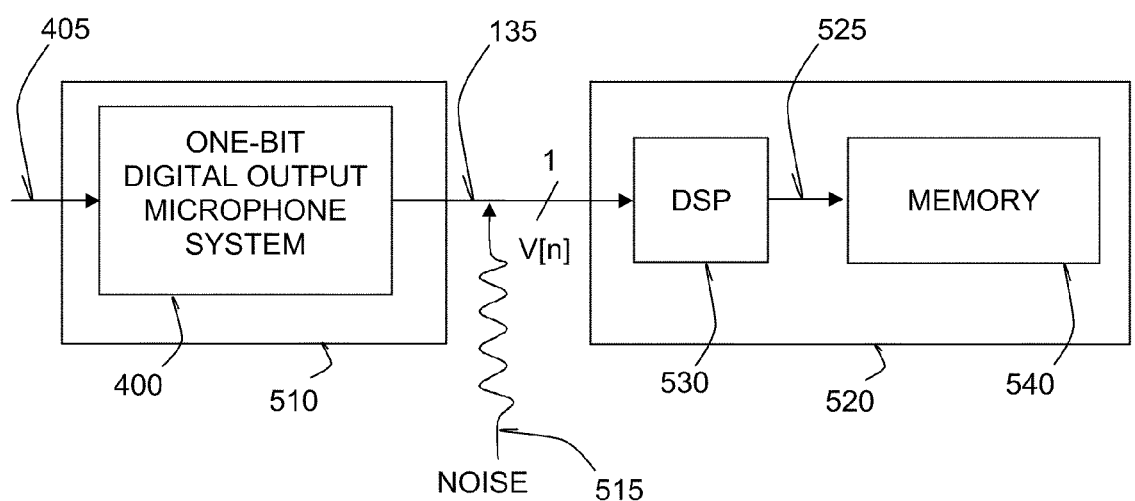
FIG. 5 is a block diagram of a whole recordable digital audio system configured in accordance with one embodiment of the present invention.

FIG. 5 is a block diagram of a recordable digital audio system 500 including one-bit digital output microphone system 400 of FIG. 4. One-bit digital output microphone system 400 can output a one-bit digital output signal. Recordable digital audio system 500 normally contains a microphone system side 510 and an audio equipment side 520, and both sides are interfaced by electrical wired-line or wirelessly so as to transfer the electrical audio signal 135 (similarly numbered in FIGS. 1 and 4). One-bit digital output microphone system 400 is in microphone system side 510. Audio equipment side 520 includes a Digital Signal Processor (DSP) 530. Audio equipment side 520 also may include a memory 540 which is, for example, a memory device or a recordable media and which can store data 525 from DSP 530. The technique of using this invention is to change an analog output signal into one-bit digital output signal on microphone system side 510 and transmit this one-bit digital output signal for outputting to audio equipment side 520 by a single digital signal line. By this, the analog characteristic is not influenced by disturbance noise 515 on the digital signal line, and there is no degradation of audio signal performance by noise 515. The interface can be made by a buffer or simple logic when both sides are interfaced by electrical wired-line. The interface can also be employed when both sides are interfaced wirelessly. A low cost, low power system is attained. One-bit digital output signal 135 output from microphone system side 510 is easily convertible into multi-bit signals, for example, 16-bit Pulse Code Modulation (PCM) signals with DSP 530 including conventional digital decimation filter at audio equipment side 520.

FIG. 6 depicts signal-to-noise+distortion ratio/dynamic range (SNDR/DR) simulation results 600 for a 1.025 kHz input signal for an embodiment of the present invention. Shown are analog DSM values 605 and hybrid DSM values 610.

FIG. 7 depicts the SNDR performance 700 for a 1.025 kHz signal with input levels from −3 dBFS to 0 dBFS for an embodiment of the present invention. Shown are analog DSM values 705 and hybrid DSM values 710.

FIG. 8 depicts SNDR/DR simulation results 800 for input frequency fu=22.000 kHz for an embodiment of the present invention. Shown are analog DSM values 805 and hybrid DSM values 810.

FIG. 9 depicts the SNDR 900 for signal input frequency fu=22.000 kHz with input levels from −3 dBFS to 0 dBFS for an embodiment of the present invention. Shown are analog DSM values 905 and hybrid DSM values 910.

Figure 10:
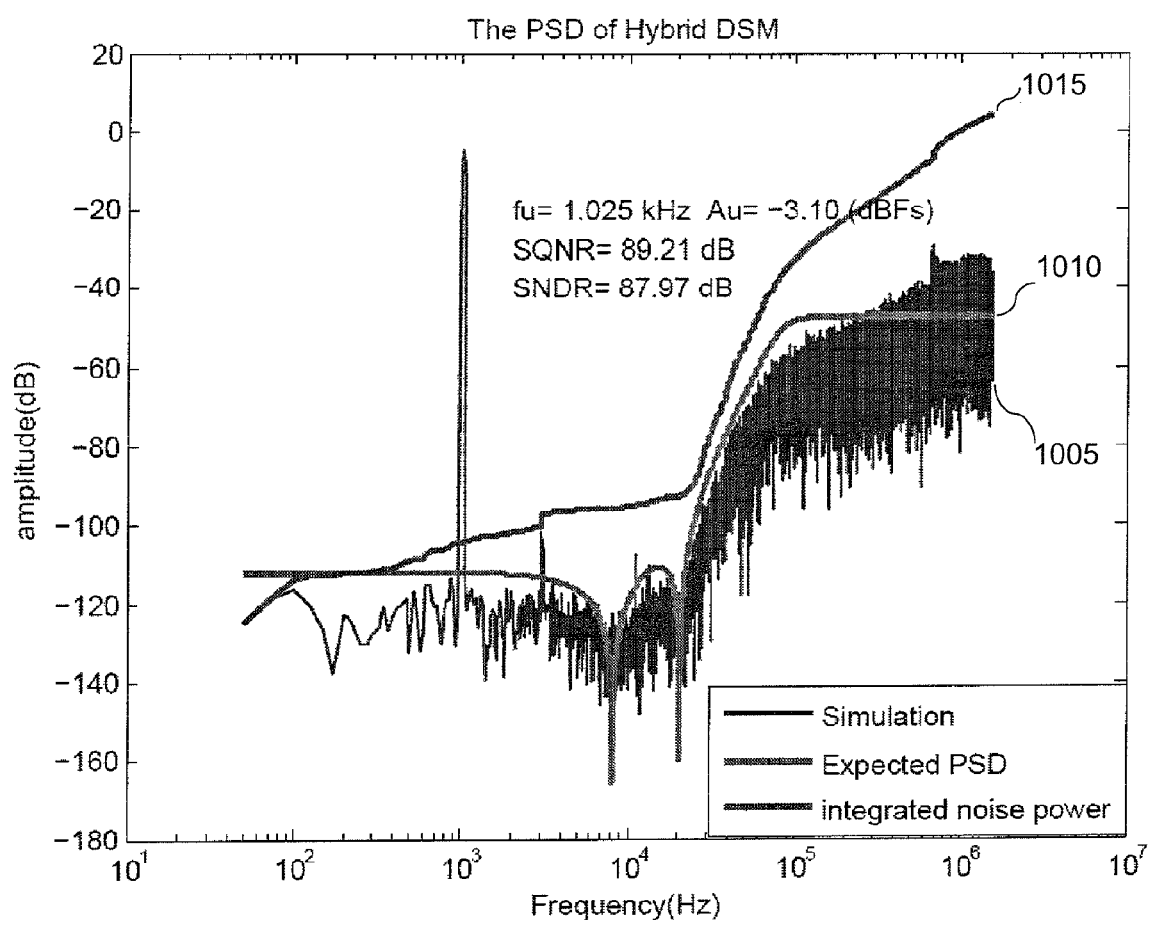
FIG. 10 depicts a power spectral density (PSD) simulation result for a −3 dBFS, 1 kHz input signal for an embodiment of the present invention.

FIG. 10 depicts a PSD simulation result 1000 for a −3 dBFS, 1 kHz input signal for an embodiment of the present invention. Specific values are input frequency fu=1.025 kHz, Au=−3.10 (dBFS), Signal-to-Quantization Noise Ratio (SQNR)=89.21 dB, and SNDR=87.97 dB. Shown are the simulated PSD 1005, the expected PSD 1010, and the integrated noise power 1015.

Figure 11:
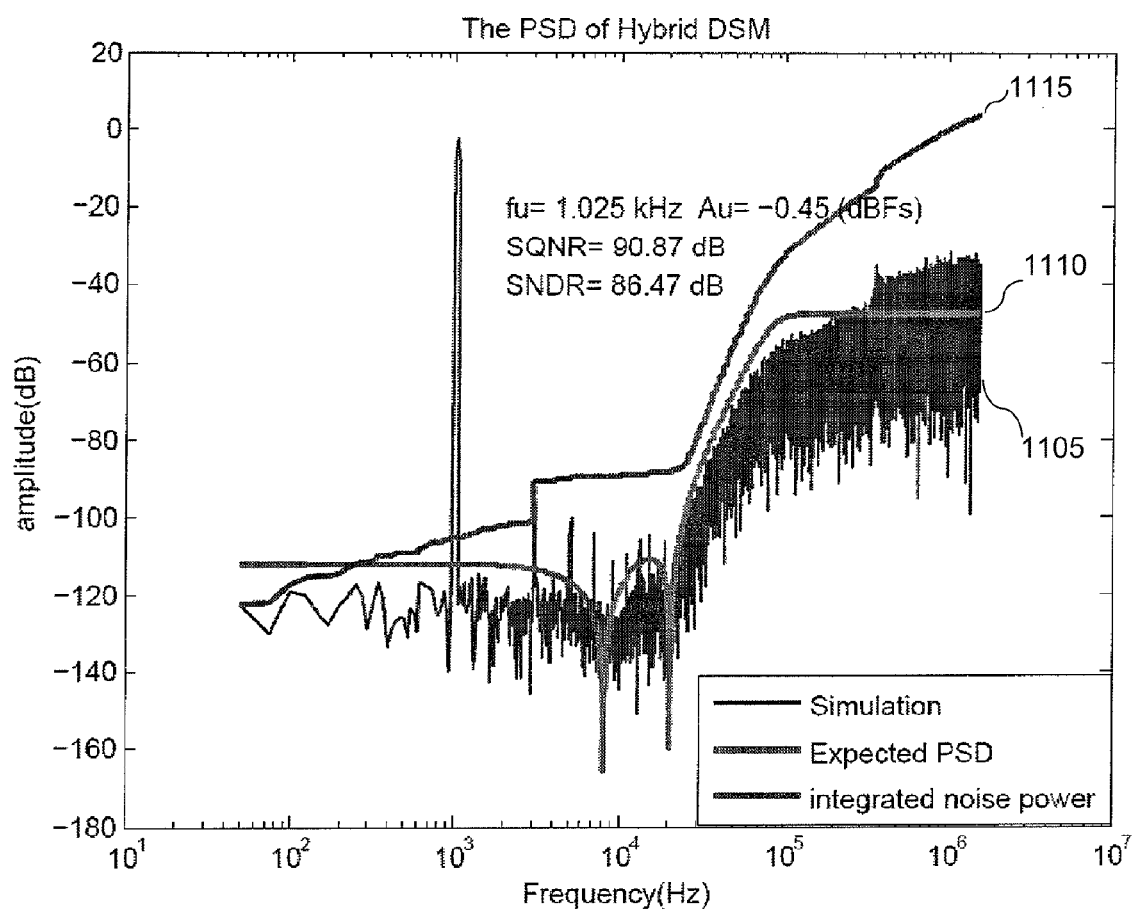
FIG. 11 depicts a PSD simulation result for a −0.45 dBFS, 1 kHz input signal for an embodiment of the present invention.

FIG. 11 depicts a PSD simulation result 1100 for a −0.45 dBFS, 1 kHz input signal for an embodiment of the present invention. Specific values are input frequency fu=1.025 kHz, Au=−0.45 (dBFS), SQNR=90.87 dB, and SNDR=86.47 dB. Shown are simulated PSD 1105, expected PSD 1110, and integrated noise power 1115.

Figure 12:
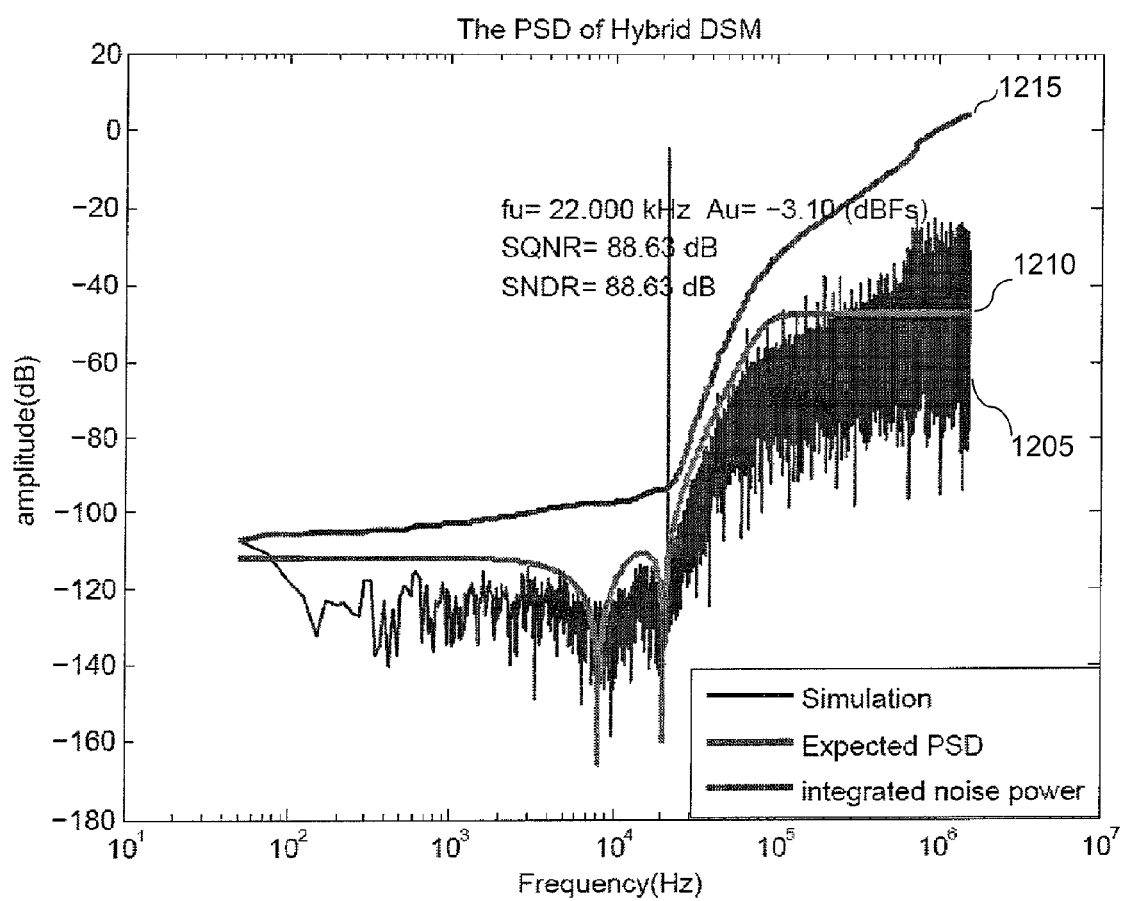
FIG. 12 depicts a PSD simulation result for a −3 dBFS, 22 kHz input signal for an embodiment of the present invention.

FIG. 12 depicts a PSD simulation result 1200 for a −3 dBFS, 22 kHz input signal for an embodiment of the present invention. Specific values are input frequency fu=22.000 kHz, Au=−3.10 (dBFS), SQNR=88.63 dB, and SNDR=88.63 dB. Shown are simulated PSD 1205, expected PSD 1210, and integrated noise power 1215.

Figure 13:
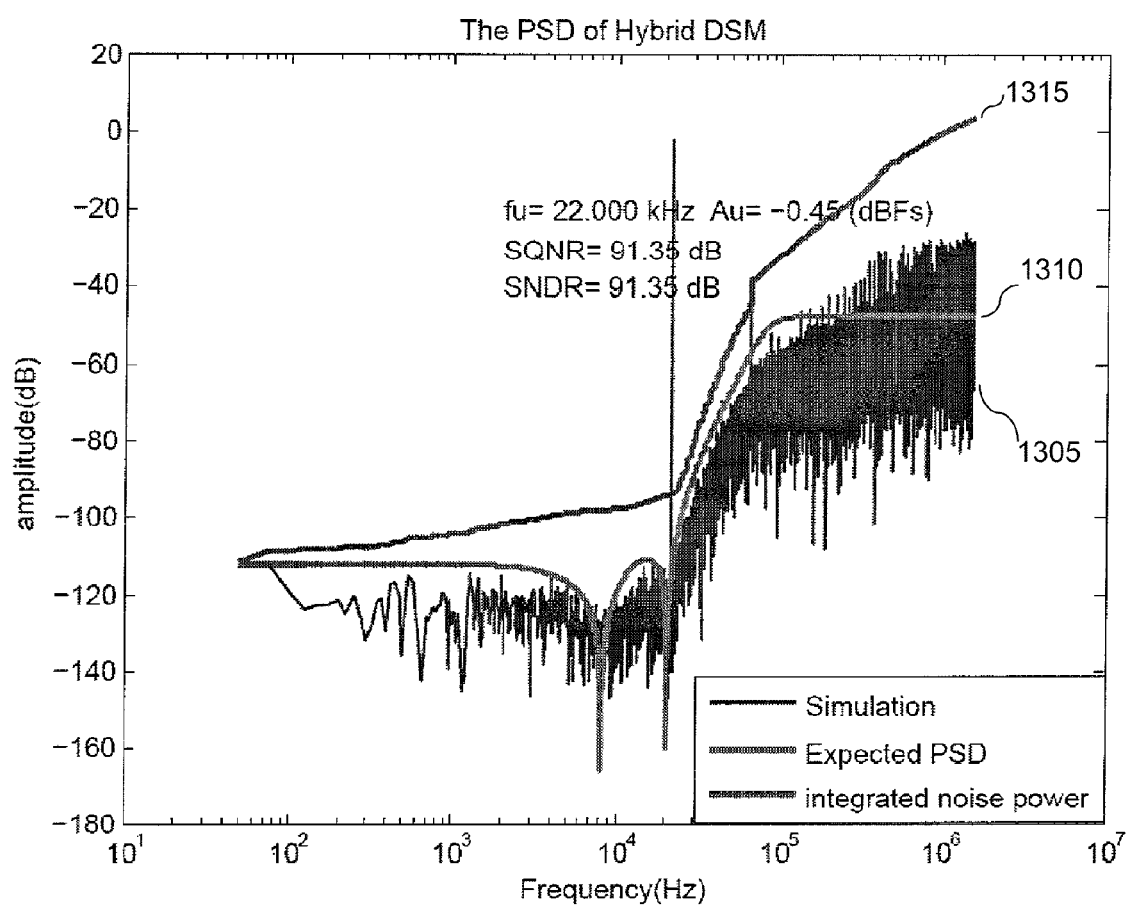
FIG. 13 depicts a PSD simulation result for a −0.45 dBFS, 22 kHz input signal for an embodiment of the present invention.

FIG. 13 depicts a PSD simulation result 1300 for a −0.45 dBFS, 22 kHz input signal for an embodiment of the present invention. Specific values are input frequency fu=22.000 kHz, Au=−0.45 (dBFS), SQNR=91.35 dB, and SNDR=91.35 dB. Shown are simulated PSD 1305, expected PSD 1310, and integrated noise power 1315.

As these results show, the system meets the specifications displayed in Table 1. Also, simulations show that the output duty ratio for a full-scale input signal is 90.5%, meeting the specification. By contrast, a single-bit analog modulator meeting the SNDR specifications needs a third- or fourth-order loop and permits input signals less than about 2 dBFS for linear operation.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A hybrid delta sigma analog to digital converter system comprising:
    an analog loop comprising a low-order analog delta-sigma modulator; and
    a digital loop comprising a higher-order single-bit digital delta-sigma modulator operably coupled to said analog loop.

2. The system of claim 1 wherein said analog modulator comprises a multi-bit quantizer.

3. The system of claim 1 wherein said analog modulator further comprises a discrete-time loop filter.

4. The system of claim 1 wherein said analog modulator further comprises a continuous-time loop filter.

5. The system of claim 1 wherein said digital loop further comprises an interstage attenuator to improve stability of said digital loop.

6. The system of claim 1 wherein said digital loop further comprises a digital low pass filter (LPF) to improve stability of said digital loop.

7. The system of claim 1 further comprising:
    an internal multi-bit digital to analog converter (DAC) employing dynamic element matching wherein in-band noise created by element mismatch is suppressed.

8. The system of claim 1 wherein said low-order analog delta-sigma modulator is a second-order analog delta-sigma modulator.

9. The system of claim 1 wherein said low-order analog delta-sigma modulator is a greater-than second-order analog delta-sigma modulator.

10. The system of claim 8 wherein said analog modulator comprises a multi-bit quantizer.

11. The system of claim 9 wherein said analog modulator comprises a multi-bit quantizer.

12. The system of claim 1 wherein said higher-order single-bit digital delta-sigma modulator is a third-order digital delta-sigma modulator.

13. The system of claim 1 wherein said higher-order single-bit digital delta-sigma modulator is a greater-than third-order digital delta-sigma modulator.

14. The system of claim 1 wherein said low-order analog delta-sigma modulator is a third-order analog delta-sigma modulator; and
    said higher-order single-bit digital delta-sigma modulator is a fourth-order digital delta-sigma modulator.

15. The system of claim 1 wherein said low-order analog delta-sigma modulator is a third-order analog delta-sigma modulator; and
    said higher-order single-bit digital delta-sigma modulator is a greater-than fourth-order digital delta-sigma modulator.

16. The system of claim 1 further comprising:
    an amplifier with fixed gain coupled to said low-order analog delta-sigma modulator.

17. The system of claim 1 further comprising:
    an amplifier with programmable gain coupled to said low-order analog delta-sigma modulator.

18. The system of claim 16 wherein said system is embodied in a single package.

19. The system of claim 16 wherein said system is embodied in a single chip.

20. The system of claim 17 wherein said system is embodied in a single package.

21. The system of claim 17 wherein said system is embodied in a single chip.

22. The system of claim 1 wherein sampling rate and resultant oversampling ratio are same for said analog loop and said digital loop.

23. A one-bit digital output microphone system comprising:
- a microphone;
- an amplifier operatively coupled to said microphone;
- a low-order analog delta-sigma modulator operatively coupled to said amplifier; and
- a higher-order single-bit digital delta-sigma modulator operably coupled to said low-order analog delta-sigma modulator.

24. The one-bit digital output microphone system of claim 23 wherein said one-bit digital output microphone system is embodied in a single package.

25. The one-bit digital output microphone system of claim 23 wherein said one-bit digital output microphone system is embodied in a single chip.

26. A method for performing a hybrid delta sigma analog to digital conversion comprising the steps of:
- receiving an analog signal;
- processing said analog signal in a low-order analog delta-sigma modulator in an analog loop;
- attenuating output of said low-order analog delta-sigma modulator in a digital loop;
- filtering in said digital loop said attenuated output of said low-order analog delta-sigma modulator to produce a filtered signal; and
- generating in a higher-order single-bit digital delta-sigma modulator in said digital loop, a digital output signal from said filtered signal.

* * * * *

UNITED STATES PATENT AND TRADEMARK OFFICE
CERTIFICATE OF CORRECTION

PATENT NO. : 7,889,108 B2  
APPLICATION NO. : 12/436813  
DATED : February 15, 2011  
INVENTOR(S) : Koichi Hamashita et al.

It is certified that error appears in the above-identified patent and that said Letters Patent is hereby corrected as shown below:

Column 7

Line 31, delete " $HNTF\_D = \dfrac{(z-1)^2(z^2 - 1.998z + 1)}{(z^2 - 1.704z + 0.7291)(z^2 - 1.65z + 0.6769)}$ ", insert -- $HNTF\_D = \dfrac{(z-1)^2(z^2 - 1.998z + 1)}{(z^2 - 1.704z + 0.7291)(z^2 - 1.85z + 0.8769)}$ --

Signed and Sealed this  
Eighth Day of November, 2011

David J. Kappos  
*Director of the United States Patent and Trademark Office*